US012035511B2

(12) United States Patent
Li et al.

(10) Patent No.: US 12,035,511 B2
(45) Date of Patent: Jul. 9, 2024

(54) CHASSIS STRUCTURE, SERVER, AND METHOD OF DISSIPATING HEAT FROM SERVER

(71) Applicant: Fulian Precision Electronics (Tianjin) Co., LTD., Tianjin (CN)

(72) Inventors: Han-Yu Li, New Taipei (TW); Wen-Hu Lu, Tianjin (CN); Li-Yi Yin, Tianjin (CN); Ming-Liang Zhang, Tianjin (CN); Shu-Tong Wang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 143 days.

(21) Appl. No.: 17/852,339

(22) Filed: Jun. 28, 2022

(65) Prior Publication Data
US 2023/0058481 A1    Feb. 23, 2023

(30) Foreign Application Priority Data

Aug. 17, 2021    (CN) .......................... 202110943986.6

(51) Int. Cl.
*H05K 7/20*    (2006.01)
(52) U.S. Cl.
CPC ................................ *H05K 7/20736* (2013.01)
(58) Field of Classification Search
CPC ................................................. H05K 7/20736
See application file for complete search history.

(56) References Cited

U.S. PATENT DOCUMENTS 7,593,225 B2 *   9/2009   Sasagawa ................. G06F 1/20
                                                    165/122

FOREIGN PATENT DOCUMENTS

| CN | 111694407 | A | * | 9/2020 | ............... G06F 1/18 |
| CN | 113238638 | A |   | 8/2021 |   |
| TW | M437978   | U1 |  | 9/2012 |   |

OTHER PUBLICATIONS

English translation of CN111694407A (Year: 2020).*

* cited by examiner

*Primary Examiner* — Mukundbhai G Patel
(74) *Attorney, Agent, or Firm* — ScienBiziP, P.C.

(57) ABSTRACT

The invention provides a chassis structure, a server, and a method of dissipating heat from server. The chassis structure comprises chassis body, two fan components, two tray components, and a power supply. The chassis body defines a receiving space bounded by two spaced partitions, the two partitions divide the receiving space into a middle cavity and two side cavities. The fan components are at one end of each side cavity and are connected to the chassis body. The two tray components carry slots for inserting hard disks. The power supply is arranged in the middle cavity and supplies power to the hard disks inserted in the slots, the power supply also has a fan, the power supply positioned at one end of the middle cavity.

13 Claims, 9 Drawing Sheets

CHASSIS STRUCTURE, SERVER, AND METHOD OF DISSIPATING HEAT FROM SERVER

FIELD

The subject herein generally relates to temperature control, and more particularly to a chassis structure, a server, and a method of dissipating heat from server.

BACKGROUND

Customers require more hard disks in servers which are smaller.

However, some server designs permitting the installation of a greater number of hard disks do not allow for adequate dissipation of heat.

SUMMARY OF THE INVENTION

The present invention is to provide a chassis structure, and a server, together with a method of dissipating heat from the server.

In a first aspect, the embodiment of the invention provides a chassis structure, comprising:
  a chassis body defining a receiving space;
  two partitions arranged in the chassis body at intervals, the two partitions dividing the receiving space into a middle cavity between the two partitions and two side cavities on either side of the middle cavity;
  two fan components connected to the chassis body, and each fan component arranged at one end of one of the two side cavities;
  two tray components received in the two side cavities, each tray component defining a plurality of slots for inserting a plurality of hard disks; and
  a power supply arranged in the middle cavity and configured to supply power to the hard disks inserted in the slots. The power supply also has a fan, the power supply positioned at one end of the middle cavity.

The chassis structure in this embodiment, uses the partition to separate the receiving space of the chassis body, and sets the power supply in the middle cavity but the tray components in the side cavities on both sides. The fan components on both sides and the power supply in the middle form three parallel air ducts in the two side cavities and the middle cavity respectively, which increases control of the air flow and greatly improves the heat dissipation efficiency. At the same time, the tray components on both sides are separated by the middle cavity with a certain spacing, avoiding lateral hard disk density which would reduce the heat dissipation performance.

Optionally, the chassis body includes a top wall and a bottom wall opposite, and two side walls facing each other, the two partitions and the two side walls are parallel to each other.

Optionally, each tray component is slidably arranged in the side cavity through a sliding component, the sliding component comprises a bracket and two sliding rails, each slide rail is connected to one of the side walls and one of the two partitions corresponds to one of the two side cavities, and are opposite to each other, the bracket comprises a bottom plate and two side plates connected to two sides of the bottom plate, the two side plates are connected to the two slide rails, so that the bracket is slidably connected to the chassis body, the tray component is connected to the bracket.

Optionally, the tray component is rotatably connected to the bracket through a hinge, the hinge comprises a first plate and a second plate rotatably connected to the first plate, the second plate is attached to the bottom of an inner side surface of one of the side plates, and a bottom surface of the tray component is attached and fixedly connected to the first plate, so that the side of the tray component away from the hinge can rotate to a position higher than the side plate on that side, so as to expose the slot opened on that side of the tray component.

Optionally, both ends of each tray component can be retracted from the two ends corresponding to one of the two side cavities to define an end air duct between the two end faces of the tray component and the outer end of the side cavity. Each end of the tray component has a lifting handle, one end of the lifting handle is rotatably connected to the tray component, and the other end of the lifting handle can be rotated to be contained in the end air duct, either in or out of the end air duct, which can rotate the tray component relative to the bracket by lifting the lifting handle.

Optionally, both sides of the tray component are separated from the side wall and partition to define a side air duct.

Optionally, the sliding component further comprises a front plate connected to the bracket, the front plate defines a plurality of air inlets, the air inlet communicates with the side air duct and the fan components to form a heat dissipating air duct.

Optionally, a front outgoing line structure and a rear outgoing line structure are at the ends of the middle cavity for the front and rear outlet of the tray component, the rear outgoing line structure and the power module are arranged side by side, the front outgoing line structure has a front air hole, which is connected to the fan through the middle cavity.

Optionally, the partition is provided with an air vent, which is located between the front outgoing line structure and the rear outgoing line structure, the air vent connects the middle cavity and the side cavity on one side to balance the air pressure of the middle cavity and the side cavity.

In the second aspect, the present embodiment also provides a method of dissipating heat from server. The server includes the foresaid chassis structure and the hard disk inserted in the slot.

The method includes:
  when the server is used, the fan component is started and the fan of the power supply to form a heat dissipating air duct in the middle cavity and the side cavity respectively to cool the server.

In the third aspect, the present embodiment also provides a server comprising the chassis structure and hard disks.

BRIEF DESCRIPTION OF THE DRAWINGS

In order to more clearly explain the technical scheme of the embodiment of the invention, the accompanying drawings in the embodiment will be briefly introduced below. It should be understood that the following accompanying drawings only show some and not all embodiments of the invention, so they should not be regarded as limiting the scope. For those skilled in the art, without paying creative labor, relevant drawings can also be developed from these drawings.

Figure 1:
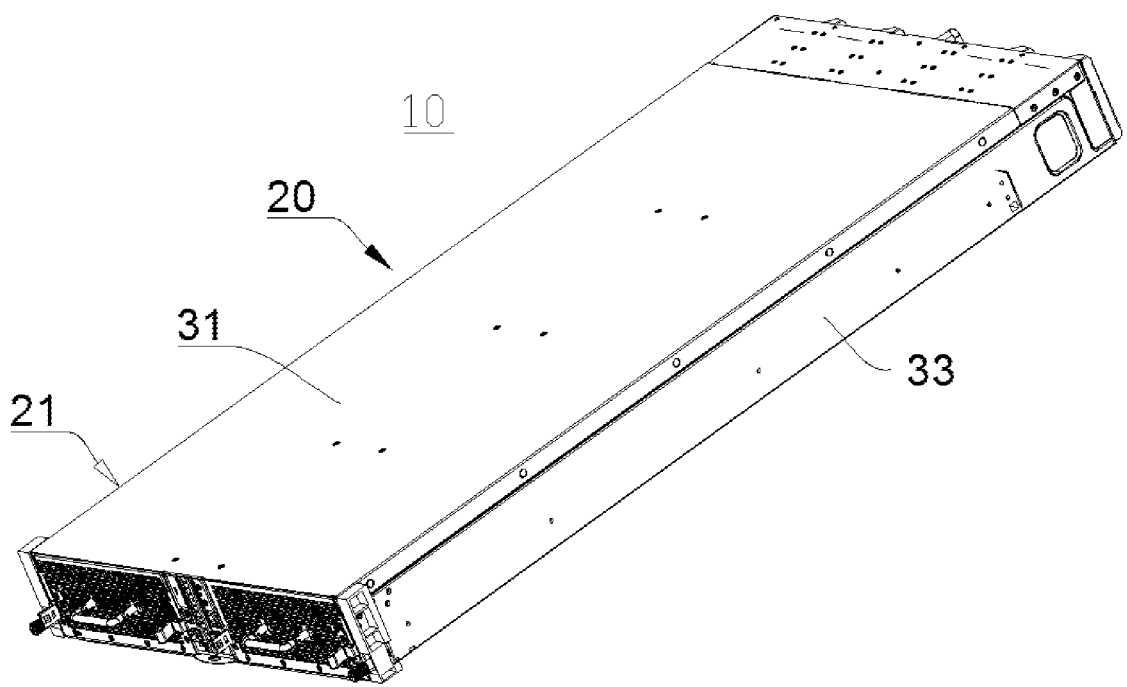
FIG. 1 is a perspective schematic view of a server according to an embodiment of the disclosure.

DESCRIPTION OF MAIN COMPONENT SYMBOLS server 10
hard disk 11
chassis structure 20
chassis body 21
fan component 22
tray component 23
power supply 24
receiving space 25
  partition 26
  middle cavity 27
  side cavity 28
  slot 29
  fan 30
  top wall 31
  bottom wall 32
  side wall 33
  sliding component 34
  bracket 35
  sliding rail 36
  bottom plate 37
  side plate 38
  trailing chain 40
  hinge 41
  first plate 42
  second plate 43
  end air duct 44
  lifting handle 45
  side air duct 46
  front plate 47
  air inlet 48
  handle 49
  hook 50
  front outgoing line structure 51
  rear outgoing line structure 52
  front air hole 53
  front interface frame 54
  front interface piece 55
  front exposed hole 56
  rear interface frame 58
  rear interface piece 59
  rear exposed hole 60
  air vent 61

DETAILED DESCRIPTION

The technical scheme in the embodiment of the application will be described in combination with the attached drawings in the embodiment of the application. Obviously, the described embodiments are only part of the embodiments of the application, not all embodiments.

It should be noted that when an element is said to be "fixed to" another element, it can be directly on another element or there can be an intervening element. When a component is "connected" to another component, it can be directly connected to another component or there may be intermediate components at the same time. When a component is "set on" another component, it can be set directly on another component or there may be intervening components at the same time. The terms "vertical", "horizontal", "left", "right" and similar expressions used in this paper are for illustrative purposes only.

Unless otherwise defined, all technical and scientific terms used herein have the same meanings as those commonly understood by those skilled in the technical field of the application. The terms used in the specification of the application herein are only for the purpose of describing specific embodiments and are not intended to limit the application. The term "and/or" as used herein includes any and all combinations of one or more related listed items.

Some embodiments of the present application are described in detail. Without conflict, the following embodiments and features in the embodiments can be combined with each other.

Embodiments of Disclosure

Figure 9:
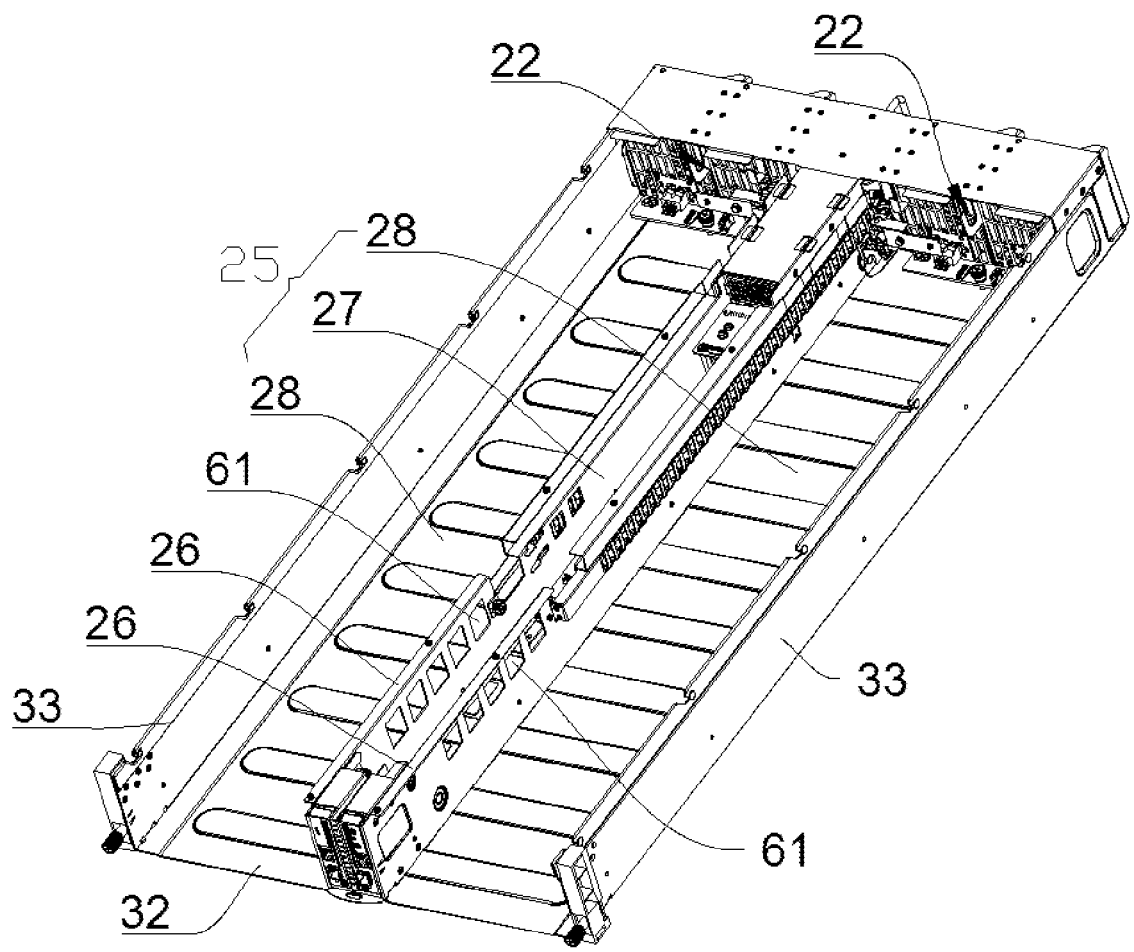
FIG. 9 is a schematic diagram of the server structure in FIG. 2 with certain parts removed.
Figure 10:
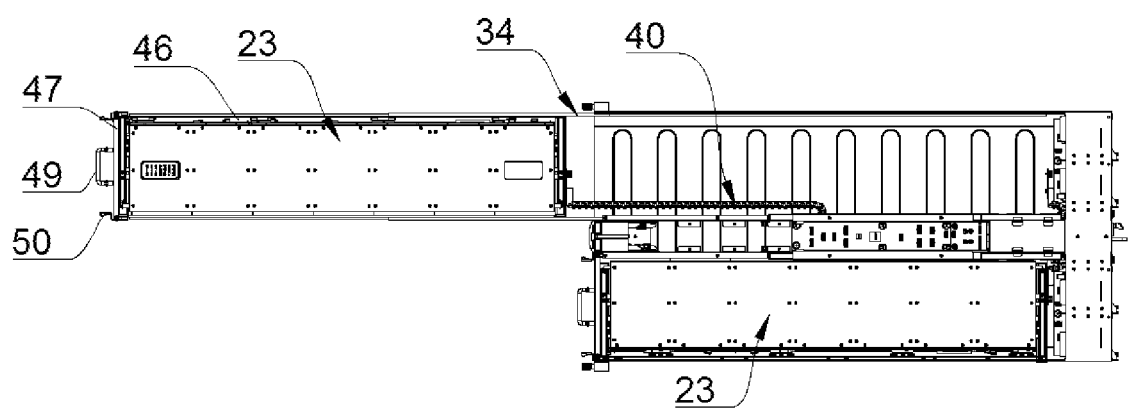
FIG. 10 is a schematic diagram of one of the tray components in FIG. 2 extended out.
Figure 11:
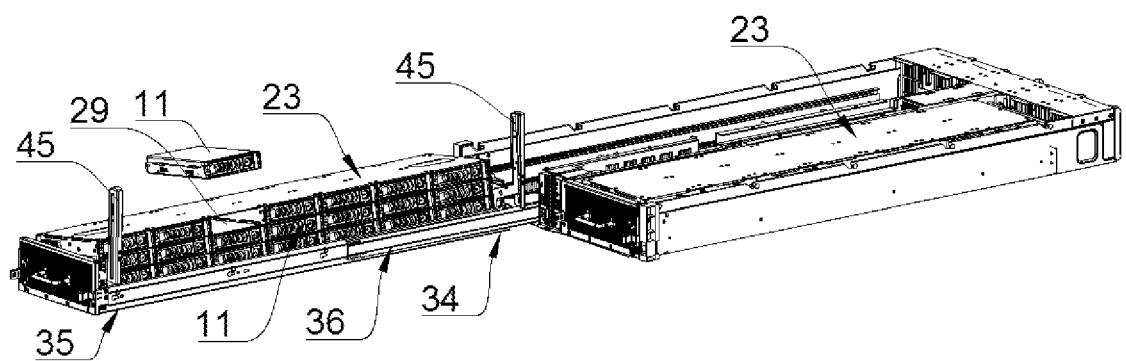
FIG. 11 is a schematic diagram of one of the tray components in FIG. 10 extended out and rotated to expose a slot.

Referring to FIGS. 1 to 11, the present embodiment provides a server 10, which includes a chassis structure 20 provided with a plurality of slots 29 and a plurality of hard disks 11 inserted in the slots 29 (the slots 29 can be seen in FIG. 11).

Figure 2:
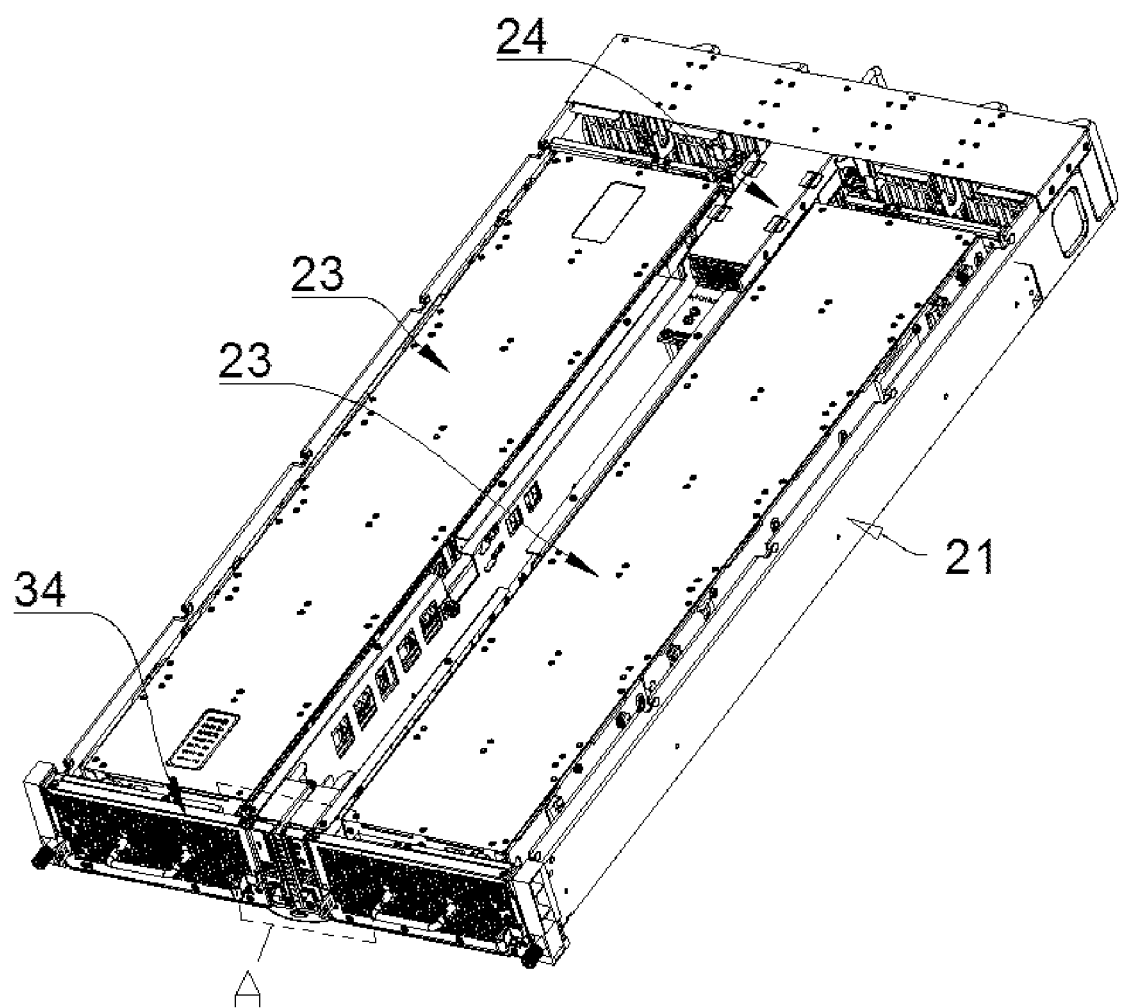
FIG. 2 is a schematic diagram of the server of FIG. 1, the top wall being removed.
Figure 3:
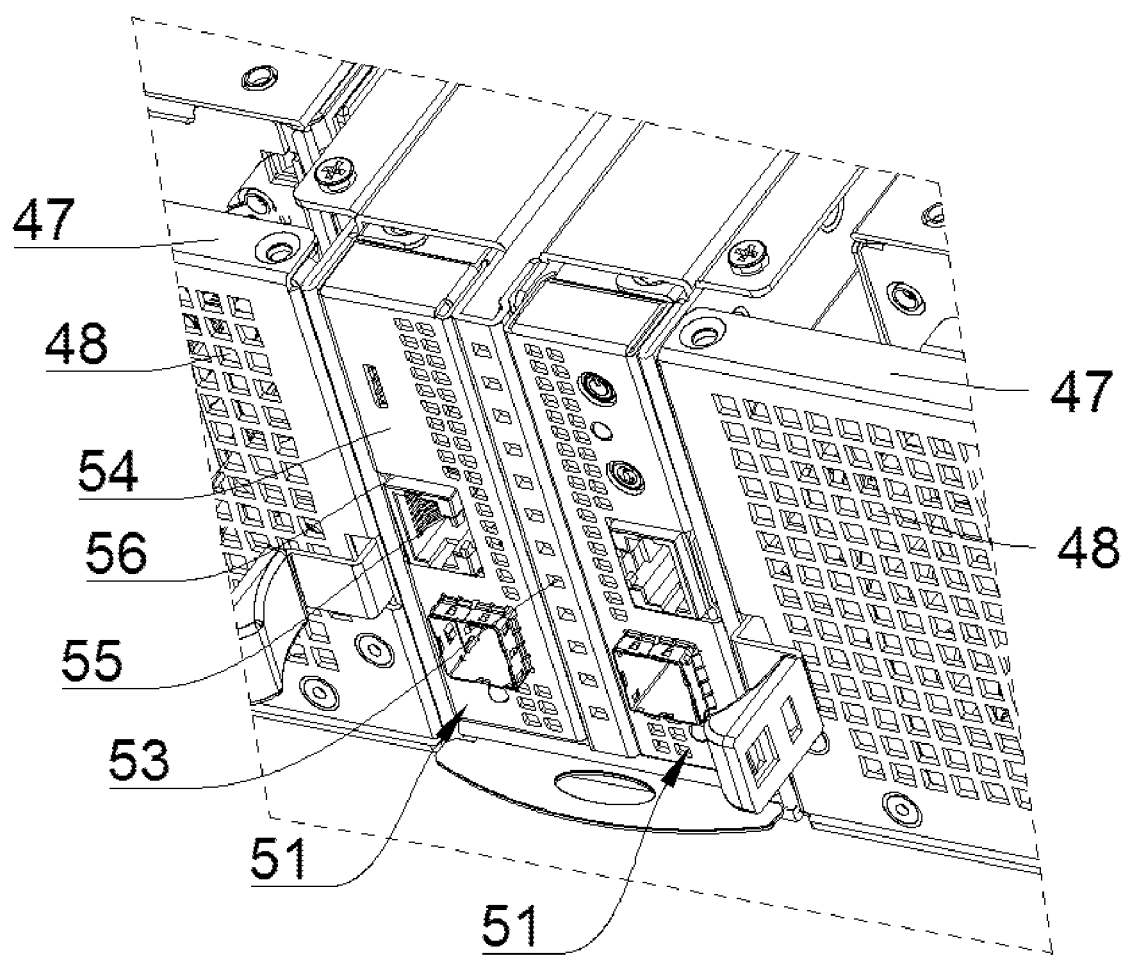
FIG. 3 is a view of circled portion A in FIG. 2.
Figure 4:
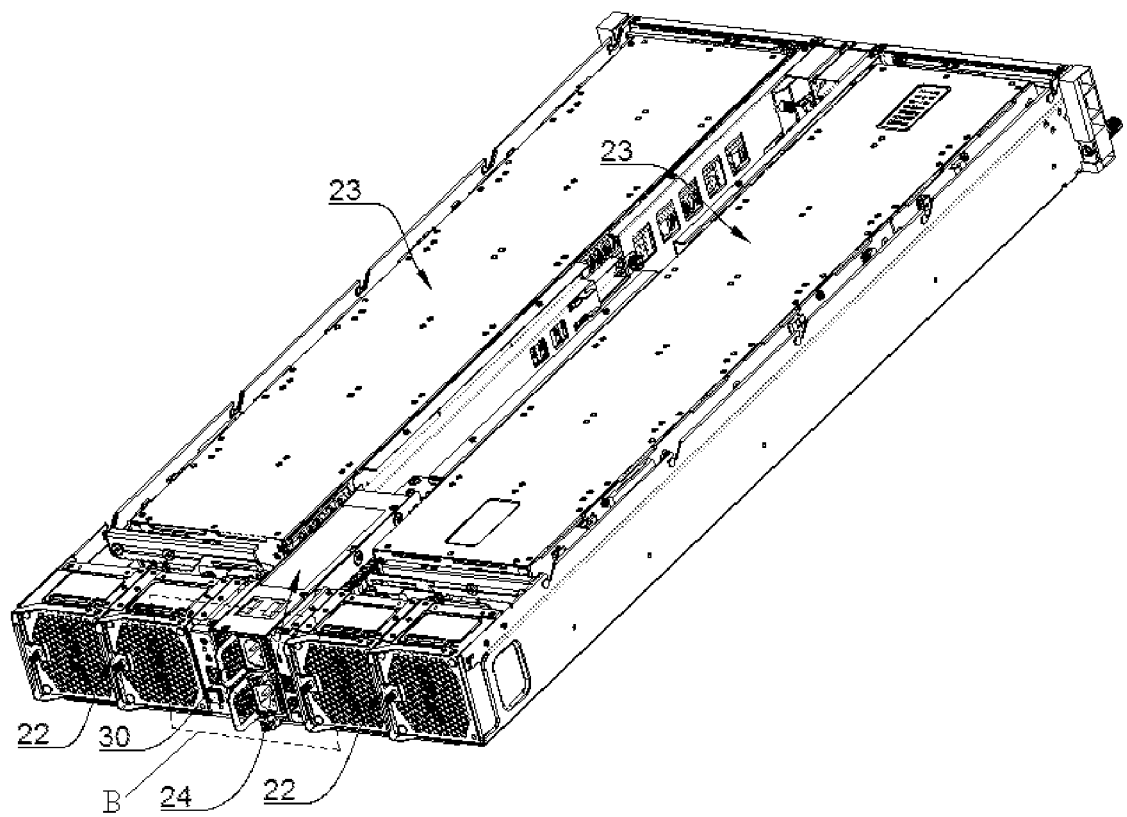
FIG. 4 is another perspective view of the server of FIG. 2.
Figure 5:
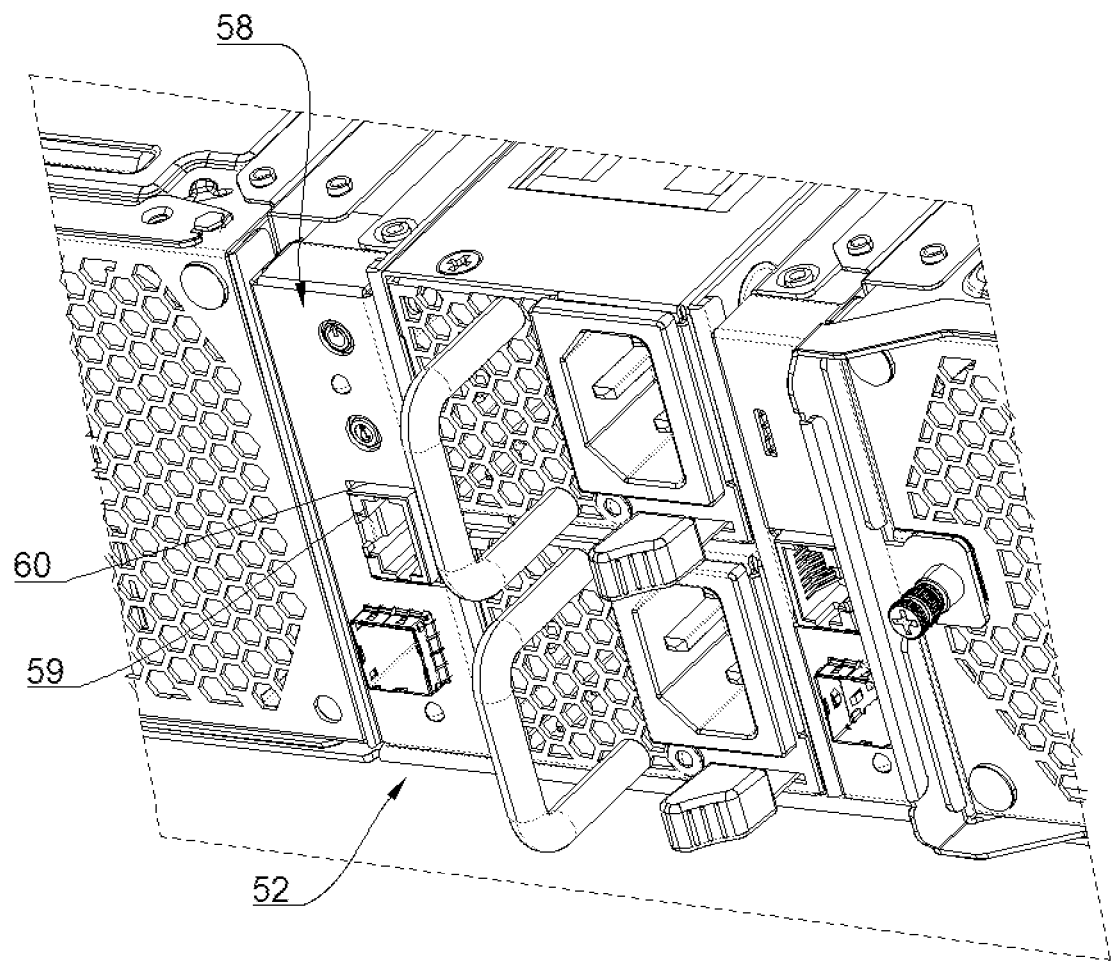
FIG. 5 is a view of B of FIG. 4.
Figure 6:
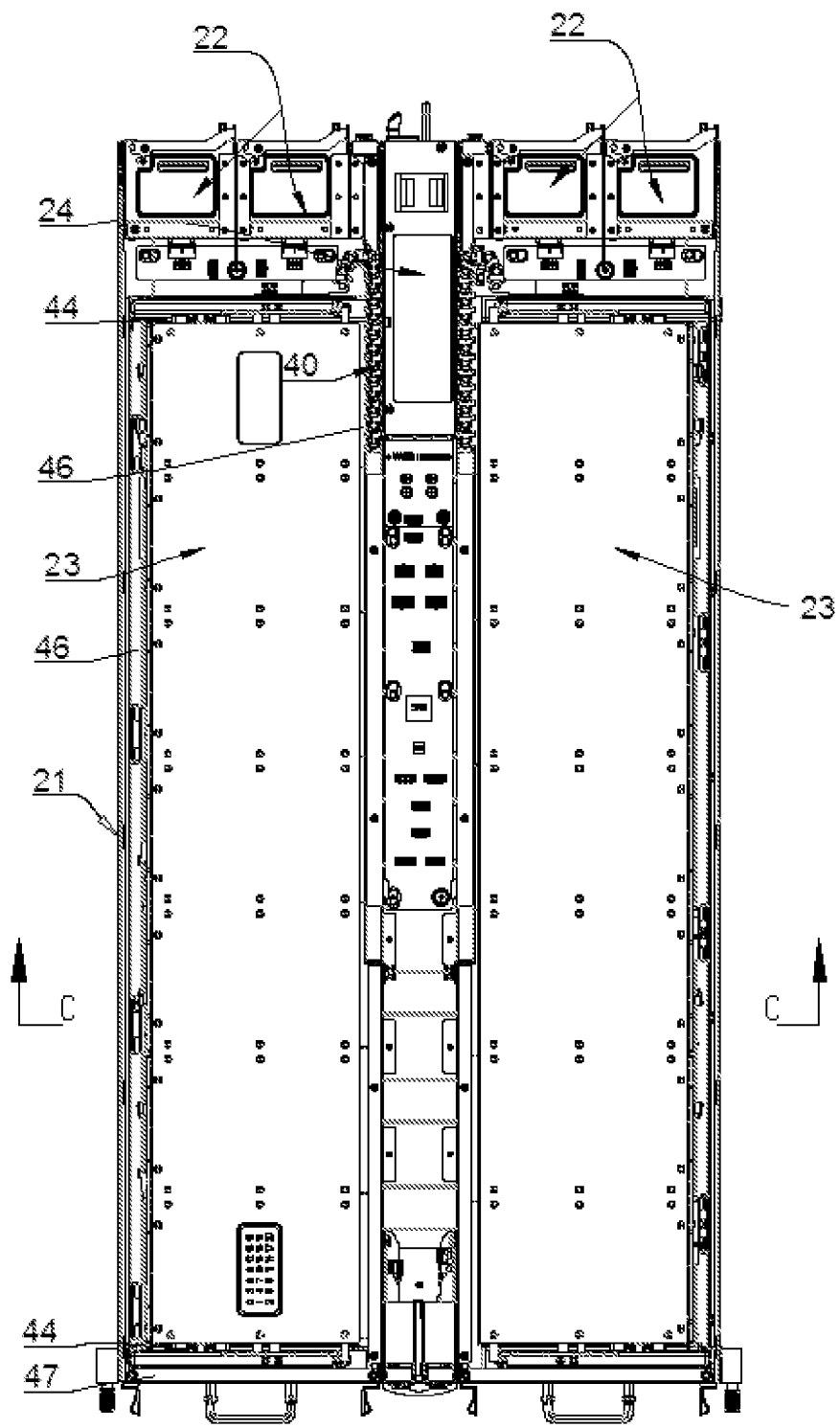
FIG. 6 is another perspective view of the server of FIG. 2.
Figure 7:
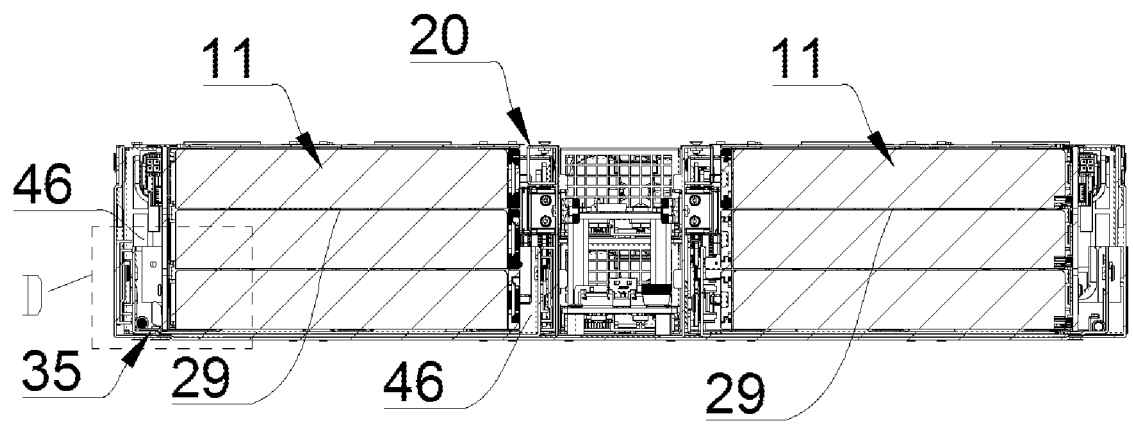
FIG. 7 is a sectional view along line C-C of FIG. 6.
Figure 8:
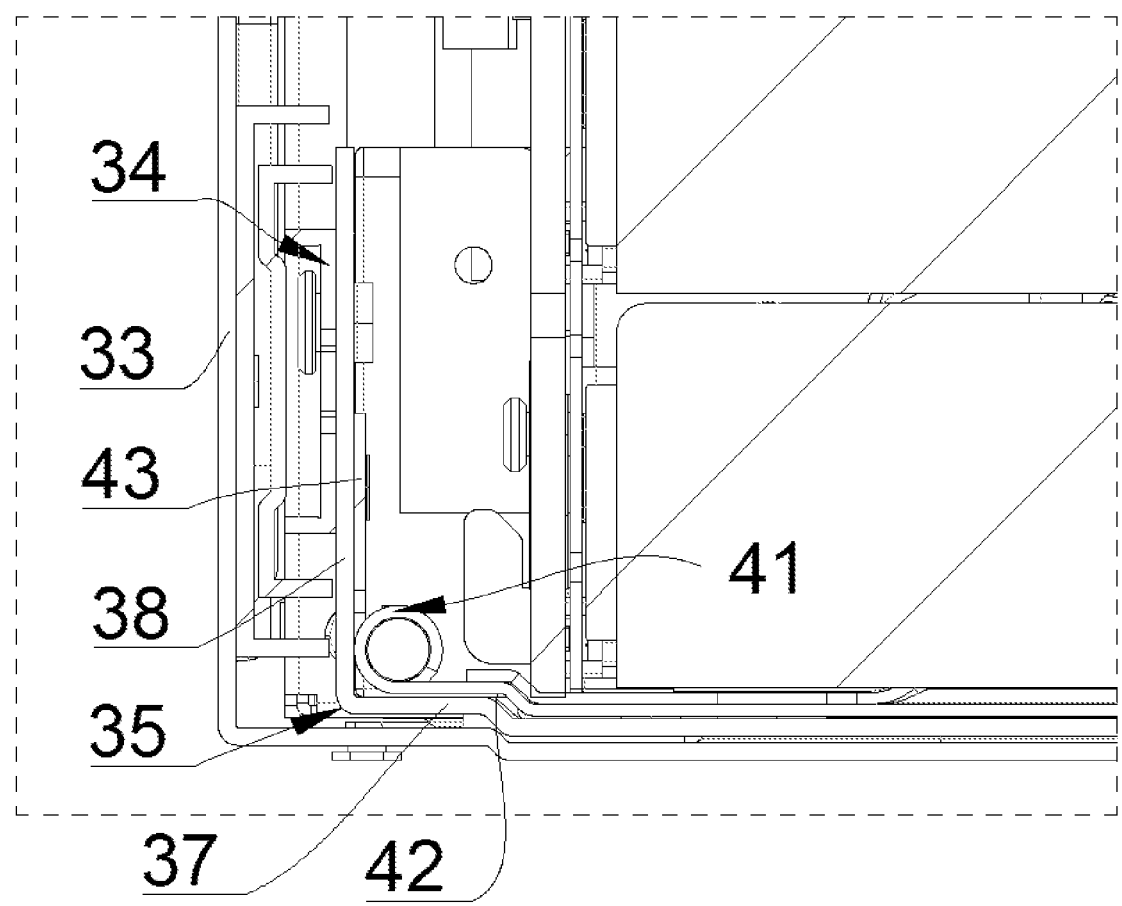
FIG. 8 is a view of D of FIG. 7.

Referring to FIGS. 2 and 6, the chassis structure 20 includes a chassis body 21, two fan components 22, two tray components 23, and a power supply 24. Referring to FIG. 9, the chassis body 21 has a receiving space 25. Two partitions 26 are arranged in the chassis body at intervals. The two partitions 26 divide the receiving space 25 into a middle cavity 27 in between the two partitions 26 and two side cavities 28 outside the two partitions 26. The fan component 22 is connected to the chassis body 21, and each fan component 22 is arranged at an end of the two side cavities 28. Referring to FIG. 11, each of the two tray components 23 defines a plurality of slots 29 for inserting hard disk 11. The two tray components 23 are installed in the side cavities 28. The power supply 24 is arranged in the middle cavity 27 and supplies power to the hard disks 11 inserted in the slot 29. The power supply 24 has a fan 30, and the power supply 24 is positioned at one end of the middle cavity 27.

In the chassis structure 20 in this embodiment, the partition 26 separates the receiving space 25 of the chassis body 21, and the power supply 24 being set in the middle cavity 27 and the tray components 23 being set in the side cavities 28 on each side. The fan component on both sides and the power supply in the middle form three parallel air ducts in the two side cavities and the middle cavity, which reduces the air flow loss and greatly improves the heat dissipation efficiency. At the same time, the tray components 23 on both sides are separated by the middle cavity 27, avoiding excessive density of the lateral hard disks 11.

In the embodiment, optionally, the chassis body 21 includes a top wall and an opposite bottom wall, two side walls face each other. The four walls together form the enclosure with openings at the front and rear. The fan component 22 and the power supply 24 are arranged at the rear openings. There is a fan component 22 arranged on both sides and the power supply 24 is arranged in the middle. The tray component 23 can be pulled out from the front opening. When the tray component 23 is not extended, part of its structure is located at the front opening of the enclosure wall, but there are holes to avoid the front opening being sealed, allowing the side cavities 28 and the middle cavity 27 to form air ducts through the front and rear openings of the enclosure.

In this embodiment, the partition 26 is parallel to the side wall 33. The space between the two partitions 26 is relatively small, so as to define the middle cavity 27, which accommodates narrow structures such as power supply 24. The spacing between the partition 26 and side walls 33 is set relatively large, so as to be about three times the spacing between the two partitions 26, this allows the tray component 23 to be set larger, so as to accommodate more hard disks 11.

Alternatively, each tray component 23 is slidably arranged in the side cavity 28 through a sliding component 34. The sliding component 34 comprises a bracket 35 and two sliding rails 36. Each of the slide rails 36 is connected to one of side wall 33 and one of the two partitions 26 and are opposite to each other. The bracket 35 comprises a bottom plate 37 and two side plates 38 connected to both sides of the bottom plate 37. The two side plates 38 are connected to the two slide rails 36, so that the bracket 35 is slidably connected to the chassis body 21. The tray component 23 is connected to the bracket 35. The sliding component 34 allows the easy extraction of the tray component 23, for hard disk extraction, insertion, maintenance, and replacement. FIG. 10 shows a hard disk 11 extracted. Alternatively, the power supply cable, signal cable, and other cables of the tray component 23 can be connected to the chassis body 21 through the trailing chain 40, so that cables can be moved while still connected.

Alternatively, the tray component 23 is rotatably connected to the bracket 35 through a hinge 41. The hinge 41 comprises a first plate 42 and a second plate 43 rotatably connected to the first plate 42. The second plate 43 is attached to the bottom of an inner side surface of one of the side plates 38, and a bottom surface of the tray component 23 is attached and fixedly connected to the first plate 42, so that the side of the tray component 23 away from the hinge 41 can rotate to a position higher than the side plate 38 on that side. This would expose the slot 29 opened on that side of the tray component 23, so as to facilitate the insertion and removal of the hard disk 11. FIG. 11 shows the tray component 23 extracted and rotated. Alternatively, the bottom plate 37 is slidably supported on the bottom wall 32 to share the load of the tray component 23 on the slide rail 36. When the tray component 23 carries more hard disks 11, this arrangement avoids an excessive loading from bending the slide rails 36.

In this embodiment, both ends of each tray component 23 are respectively retracted from the two ends corresponding to one of the two side cavities 28, to define an end air duct 44 between the two end faces of the tray component 23 and the outer end of the side cavity 28. The ends of the tray components 23 are fitted with a lifting handle 45. One end of the lifting handle 45 is rotatably connected to the tray component 23, and the other end of the lifting handle 45 can be rotated to be contained in an end air duct 44 or out of the end air duct 44, which is used to rotate the tray component 23 relative to the bracket 35 by lifting the lifting handle 45. The lifting handle 45 can be stored in the space of the end air duct 44, it being smaller in size than the end air duct 44 to avoid blocking the air flow of the end air duct 44. One end of the lifting handle 45 can be lifted to realize rotation of the tray component 23. Alternatively, both sides of the tray component 23 are separated from the side wall 33 and partition 26 to define a side air duct 46. Alternatively, the spacing between the two side plates 38 is greater than the lateral dimension of the tray component 23, and both sides of the tray component 23 are separated from the side plates 38. In this way, heat dissipation of the tray component 23 is less influenced by the side plate 38.

Alternatively, the slide rail 36 is arranged on the side close to the bottom plate 37, and its vertical dimension is less than the spacing between the top wall 31 and the bottom wall 32. The vertical dimension of the side plate 38 approximately matches the vertical dimension of the slide rail 36. Thus, the slide rail 36 and the side plate 38 near the top wall 31 are not blocked, and the lateral width of the side air duct 46 is approximately the same distance as that between the side of the tray component 23 and the side wall 33. Near the bottom wall 32, the lateral width of the side air duct 46 is approximately the same as the distance from the side of the tray component 23 to the side plate 38. Overall, such side air duct 46 can achieve better heat dissipation while also permitting the installation of various structural parts.

In this embodiment, the sliding component 34 further comprises a front plate 47 connected to the bracket 35. The front plate 47 define a plurality of air inlets 48. The air inlet 48 and the fan component 22 communicate through the side air duct 46 to form a heat dissipating air duct. The outside of the front plate 47 is fitted with a handle 49 for pulling and a hook 50 for clamping. When the tray component 23 and the sliding component 34 are retracted inside, the hook 50 clamps to the chassis body 21. To pull out the tray component 23, the hook 50 is unlocked, and then the handle 49 is lifted.

In this embodiment, a front outgoing line structure 51 and a rear outgoing line structure 52 are at the ends of the middle cavity 27 for the front and rear outlet of the tray component 23. The rear outgoing line structure 52 and the power supply 24 are arranged side by side. The front outgoing line structure 51 has a front air hole 53, which is connected to the fan 30 through the middle cavity 27. Alternatively, the front outgoing line structure 51 includes a front interface frame 54 and a plurality of front interface pieces 55 installed on the front interface frame 54. A front exposed hole 56 and a front air hole 53 are on the front interface frame 54. The front interface piece 55 is exposed from the front exposed hole 56. The rear outgoing line structure 52 includes a rear interface frame 58 and a plurality of rear interface pieces 59 installed on the rear interface frame 58. A rear exposed hole 60 is arranged on the rear interface frame 58. The rear interface piece 59 is exposed from the rear exposed hole 60. By these means, the chassis structure 20 in this embodiment can conveniently realize front and rear outgoing lines at the same time.

In this embodiment, the partition 26 is provided with an air vent 61, which is located between the front outgoing line structure 51 and the rear outgoing line structure 52. The air vent 61 connects with the middle cavity 27 and the side cavity 28 on each side to balance the air pressure of the middle cavity 27 and each side cavity 28. The air vent 61 includes holes longitudinally arranged along the partition 26, and each hole is in a section of the partition 26 away from the fan component 22. In this embodiment, by opening the air vent 61 at the section of the partition 26 away from the fan component 22, the problem of a small and insufficient air inlet area when the outgoing line structure is set at the front and rear of the chassis structure 20 can be compensated, so that the air entering from the front plate 47 can partially flow into the middle cavity 27 at the air inlet section. That is, not only is there a sufficient air inlet for the middle cavity 27 and the two side cavities 28, for heat dissipation, but the relative independence of the air ducts of the three cavities is maintained to a certain extent, especially in the section where the air vent 61 is close to the fan component 22 to further enhance the heat dissipation.

The present embodiment further provides a method of dissipating heat from server, which includes:

Starting the fan component 22 and the fan 30 to form a heat dissipating air duct in the middle cavity 27 and the side cavity 28 when the server is used, so as to cool the server 10.

The above embodiments are only used to illustrate the technical solution of the application rather than for limitation. Although the application is described in detail with reference to the above preferred embodiments, those skilled in the art should understand that any modification or equivalent replacement of the technical solution of the application should not deviate from the spirit and scope of the technical solution of the application.

What is claimed is:

1. A chassis structure, comprising:
   a chassis body defining a receiving space; two partitions arranged in the chassis body at intervals, the two partitions dividing the receiving space into a middle cavity between the two partitions and two side cavities on either side of the middle cavity;
   two fan components connected to the chassis body, and each fan component arranged at one end of one of the two side cavities;
   two tray components received in the two side cavities, each tray component defining a plurality of slots for inserting a plurality of hard disks; and
   a power supply arranged in the middle cavity and configured to supply power to the hard disks inserted in the slots, the power supply has a fan, the power supply positioned at one end of the middle cavity;
   wherein the chassis body includes a top wall and a bottom wall opposite from top to bottom, and two side walls facing each other, the two partitions and the two side walls are parallel to each other;
   wherein each tray component is slidably arranged in the side cavity through a sliding component, the sliding component comprises a bracket and two sliding rails, each slide rail is connected to one of the side walls and one of the two partitions corresponds to one of the two side cavities, and are opposite to each other;
   the bracket comprises a bottom plate and two side plates connected to two sides of the bottom plate, the two side plates are connected to the two slide rails, so that the bracket is slidably connected to the chassis body, the tray component is connected to the bracket;
   wherein the tray component is rotatably connected to the bracket through a hinge, the hinge comprises a first plate and a second plate rotatably connected to the first plate, the first plate is attached to the bottom of an inner side surface of one of the side plates, and a bottom surface of the tray component is attached and fixedly connected to the second plate, so that the side of the tray component away from the hinge can rotate to a position higher than the side plate on that side, so as to expose the slot opened on that side of the tray component.

2. The chassis structure of claim 1, wherein both ends of each tray component can be retracted from the two ends corresponding to one of the two side cavities to define an end air duct between the two end faces of the tray component and the outer end of the side cavity, each end of the tray component has a lifting handle, one end of the lifting handle is rotatably connected to the tray component, and the other end of the lifting handle can be rotated to be contained in the end air duct, either in or out of the end air duct, which is used to rotate the tray component relative to the bracket by lifting the lifting handle.

3. The chassis structure of claim 1, wherein both sides of the tray component are separated from the side wall and partition to define a side air duct.

4. The chassis structure of claim 3, wherein the sliding component further comprises a front plate connected to the bracket, the front plate defines a plurality of air inlets, the air inlet communicates with the side air duct and the fan components to form a heat dissipating air duct.

5. The chassis structure of claim 1, wherein a front outgoing line structure and a rear outgoing line structure are at the ends of the middle cavity for the front and rear outlet of the tray component, the rear outgoing line structure and the power module are arranged side by side, the front outgoing line structure has a front air hole, which is connected to the fan through the middle cavity.

6. The chassis structure of claim 5, wherein the partition is provided with an air vent, which is located between the front outgoing line structure and the rear outgoing line structure, the air vent connects the middle cavity and the side cavity on one side to balance the air pressure of the middle cavity and the side cavity.

7. A method of dissipating heat from server the server comprises the chassis structure of claim 1 and a hard disk inserted in the slot, the method comprising:
   triggering the fan component and the fan of the power supply to form a heat dissipating air duct in the middle cavity and the side cavity respectively when the server is used, cool the server.

8. A server, comprising:
   a hard disk; and
   a chassis structure, the chassis structure comprising:
   a chassis body defining a receiving space;
   two partitions arranged in the chassis body at intervals, the two partitions dividing the receiving space into a middle cavity between the two partitions and two side cavities on either side of the middle cavity;
   two fan components connected to the chassis body, and each fan component arranged at one end of one of the two side cavities;
   two tray components received in the two side cavities, each tray component defining a plurality of slots for inserting a plurality of hard disks; and
   a power supply arranged in the middle cavity and configured to supply power to the hard disks inserted in the slots, the power supply has a fan, the power supply positioned at one end of the middle cavity;
   wherein the chassis body includes a top wall and a bottom wall opposite from top to bottom, and two side walls facing each other, the two partitions and the two side walls are parallel to each other;
   wherein each tray component is slidably arranged in the side cavity through a sliding component, the sliding component comprises a bracket and two sliding rails, each slide rail is connected to one of the side walls and one of the two partitions corresponds to one of the two side cavities, and are opposite to each other;
   the bracket comprises a bottom plate and two side plates connected to two sides of the bottom plate, the two side plates are connected to the two slide rails, so that the bracket is slidably connected to the chassis body, the tray component is connected to the bracket;

wherein the tray component is rotatably connected to the bracket through a hinge, the hinge comprises a first plate and a second plate rotatably connected to the first plate, the first plate is attached to the bottom of an inner side surface of one of the side plates, and a bottom surface of the tray component is attached and fixedly connected to the second plate, so that the side of the tray component away from the hinge can rotate to a position higher than the side plate on that side, so as to expose the slot opened on that side of the tray component.

9. The server of claim 8, wherein both ends of each tray component can be retracted from the two ends corresponding to one of the two side cavities to define an end air duct between the two end faces of the tray component and the outer end of the side cavity, each end of the tray component has a lifting handle, one end of the lifting handle is rotatably connected to the tray component, and the other end of the lifting handle can be rotated to be contained in the end air duct, either in or out of the end air duct, which is used to rotate the tray component relative to the bracket by lifting the lifting handle.

10. The server of claim 8, wherein both sides of the tray component are separated from the side wall and partition to define a side air duct.

11. The server of claim 10, wherein the sliding component further comprises a front plate connected to the bracket, the front plate defines a plurality of air inlets, the air inlet communicates with the side air duct and the fan components to form a heat dissipating air duct.

12. The server of claim 8, wherein a front outgoing line structure and a rear outgoing line structure are at the ends of the middle cavity for the front and rear outlet of the tray component, the rear outgoing line structure and the power module are arranged side by side, the front outgoing line structure has a front air hole, which is connected to the fan through the middle cavity.

13. The server of claim 12, wherein the partition is provided with an air vent, which is located between the front outgoing line structure and the rear outgoing line structure, the air vent connects the middle cavity and the side cavity on one side to balance the air pressure of the middle cavity and the side cavity.

* * * * *